(12) United States Patent
Ezaki et al.

(10) Patent No.: US 6,515,835 B2
(45) Date of Patent: Feb. 4, 2003

(54) PRECISE POSITIONING ACTUATOR ACTUATOR FOR PRECISELY POSITIONING THIN-FILM MAGNETIC HEAD ELEMENT AND HEAD GIMBAL ASSEMBLY WITH THE ACTUATOR

(75) Inventors: Joichiro Ezaki, Tokyo (JP); Takashi Honda, Tokyo (JP)

(73) Assignee: TDK Corporation, Tokyo (JP)

( * ) Notice: Subject to any disclaimer, the term of this patent is extended or adjusted under 35 U.S.C. 154(b) by 176 days.

(21) Appl. No.: 09/764,109

(22) Filed: Jan. 19, 2001

(65) Prior Publication Data

US 2002/0008942 A1 Jan. 24, 2002

(30) Foreign Application Priority Data

Jan. 27, 2000 (JP) ........................................ 2000-018707

(51) Int. Cl.⁷ ............................. G11B 21/24; G11B 5/56
(52) U.S. Cl. ................................................... 360/294.4
(58) Field of Search ............................... 310/328, 367; 360/245.3, 294.4

(56) References Cited

U.S. PATENT DOCUMENTS

| | | | |
|---|---|---|---|
| 5,453,653 A | * | 9/1995 | Zumeris ..................... 310/315 |
| 5,745,319 A | | 4/1998 | Takekado et al. |
| 6,118,637 A | * | 9/2000 | Wright et al. ............ 360/245.3 |
| 6,222,706 B1 | * | 4/2001 | Stefansky et al. ....... 360/294.5 |

FOREIGN PATENT DOCUMENTS

| | | |
|---|---|---|
| JP | 8-180623 | 7/1996 |
| JP | 10-225146 | 8/1998 |
| JP | 11-277740 | 10/1999 |

* cited by examiner

Primary Examiner—William Korzuch
Assistant Examiner—Mark Blouin
(74) Attorney, Agent, or Firm—Burns, Doane, Swecker & Mathis, L.L.P.

(57) ABSTRACT

An actuator for precisely positioning an object to be positioned is fixed between the object and a support member. The actuator has a displacement generation part which includes a solid piezoelectric material member, a common electrode formed on one surface of the piezoelectric material member to cover substantially whole of the one surface, and first and second electrodes formed on the other surface opposite to the one surface, of the piezoelectric material member to superimpose to the common electrode. The first and second electrodes have side edges facing with each other via a uniform width space, respectively.

24 Claims, 7 Drawing Sheets

LOAD POINT

PRECISE POSITIONING ACTUATOR ACTUATOR FOR PRECISELY POSITIONING THIN-FILM MAGNETIC HEAD ELEMENT AND HEAD GIMBAL ASSEMBLY WITH THE ACTUATOR

FIELD OF THE INVENTION

The present invention relates to a piezoelectric actuator for precisely positioning an object, to a piezoelectric actuator for precisely positioning a thin-film magnetic head element used in a magnetic hard disk drive (HDD) and to a head gimbal assembly (HGA) with the precise positioning actuator.

DESCRIPTION OF THE RELATED ART

In the magnetic HDD, thin-film magnetic head elements for writing magnetic information into and/or reading magnetic information from magnetic disks are in general formed on magnetic head sliders flying in operation above the rotating magnetic disks. The sliders are supported by suspensions of the HGAs at their top end sections.

Recently, recording and reproducing density along the radial direction or track width direction in the magnetic disk (track density) rapidly increase to satisfy the requirement for ever increasing data storage capacities and densities in today's HDDs.

For advancing the track density, the position control of the magnetic head element with respect to the track in the magnetic disk by only a voice coil motor (VCM) has never presented enough accuracy. In order to solve this problem, another actuator is additionally mounted at a position nearer to the magnetic head slider than the VCM so as to perform fine precise positioning that cannot be realized by the VCK only. These techniques for realizing precise positioning of the magnetic head are described in for example U.S. Pat. No. 5,745,319 and Japanese unexamined patent publication No. 08180623A.

A typical structure of a conventional piezoelectric precise positioning actuator as the another actuator is shown in FIG. 1. This actuator called as a bimorph piezoelectric actuator has a metal plate or common electrode 12 sandwiched and adhered between two piezoelectric blocks 10 and 11, and drive electrodes 13 and 14 adhered to outer surfaces of the piezoelectric blocks 10 and 11, respectively. When electrical fields directed to opposite directions with each other are produced in the piezoelectric blocks 10 and 11 by respectively applying voltages with opposite phases between the drive electrode 13 and the common electrode 12 and between the drive electrode 14 and the Common electrode 12, these blocks 10 and 11 will expand and contract, respectively, causing the actuator to bend in a direction perpendicular to the electrodes.

However, this bimorph piezoelectric actuator can be formed only in a simply shaped single layer structure as shown in FIG. 1. Namely, it is very difficult to realize a piggyback bimorph multi-layered actuator with a shape of a tuning fork due to its complicated shape, weak mechanical strength depending upon the stacked direction and complicated layout of external electrodes.

Japanese examined patent publication No. 10225146A discloses a unimorph piezoelectric actuator with piezoelectric ceramics layers stacked on a non-piezoelectric bottom ad. The thicknesses of the respective stacked piezoelectric ceramics layers are gradually thinned in order outward from the bottom layer, the piezoelectric constants $d_u$ of the respective stacked ceramics are gradually increased in order outward from the bottom layer, or the voltages applied to the respective stacked ceramics layers are gradually increased in order outward from the bottom layer so that the stacked ceramics layers bend toward the stacked direction.

However, since this bimorph piezoelectric actuator has to a stack piezoelectric ceramics layers with gradually differed thicknesses, gradually differ ed piezoelectric constants $d_u$ or gradually differed applied voltages, not only the structure increases in complexity but also the manufacturing process becomes very complicated.

The assignee of the instant application has already proposed a piggyback unimorph actuator shown in FIG. 2. This piggyback actuator has two fixing parts 20 and 21 at its end sections and two rod shaped beam parts 22 and 23 arranged in parallel for coupling these fixing parts 20 and 21. An air gap 24 is formed between these beam parts 22 and 23. The fixing parts 20 and 21 have a larger width than that of the beam parts 22 and 23 so that sufficient fixing force can be ensured. Thus, the actuator is formed ion a tuning fork shape. The actuator has a stacked structure fabricated by alternately stacking one piezoelectric layer with a common electrode formed thereon and another piezoelectric layer with a drive electrode formed thereon. By applying voltages with the reversed phase across the drive electrode and the common electrode of the beam part 22 and across the drive electrode and the common electrode of the beam part 23, these beam parts will expand and contract, respectively, causing the actuator to bend in a plane of the electrodes.

However, since the air gap 24 between the beam parts 22 and 23 in this piggyback unimorph actuator shown in FIG. 2 is very narrow as about 50 μm for example, it is necessary to use an expensive microfabrication process such as a powder-beam etching process which utilizes very fine grains for fabricating the actuator causing the manufacturing cost to greatly increase. Also, since there is a limit in fabrication of the narrower air gap, a larger bending amount or a larger stroke of displacement of the actuator cannot be expected. In addition, such air gap will remarkably reduce the shock resistance of the actuator itself.

SUMMARY OF THE INVENTION

It is therefore an object of the present invention to provide an actuator for precisely positioning an object, an actuator for precisely positioning a thin-film magnetic head element and a HGA with the precise positioning actuator, whereby simple structure and easy manufacture of the actuator can be expected.

Another object of the present invention is to provide an actuator for precisely positioning an object, an actuator for precisely positioning a thin-film magnetic head element and a HGA with the precise positioning actuator, whereby high shock resistance of the actuator can be expected.

Further object of the present invention is to provide an actuator for precisely positioning an object, an actuator for precisely positioning a thin-film magnetic head element and a HGA with the precise positioning actuator, whereby stroke of displacement can be easily controlled and large stroke of displacement can be expected.

According to the present invention, an actuator for precisely positioning an object to be positioned is provided. This actuator is fixed between the object and a support member and has a displacement generation part. The displacement part includes a solid piezoelectric material member, a common electrode formed on one surface of the piezoelectric material member to cover substantially whole of the one surface, and first and second electrodes formed on the other surface opposite to the one surface, of the piezoelectric material member to superimpose to the common electrode. The first and second electrodes have side edges facing with each other via a uniform width space, respectively.

Also, according to the present invention, an actuator for precisely positioning at least one thin-film magnetic head element to be positioned is provided. This actuator is fixed between a magnetic head slider with the at least one thin-film magnetic head element and a support member and has a displacement generation part. The displacement part includes a solid piezoelectric material member, a common electrode formed on one surface of the piezoelectric material member to cover substantially whole of the one surface, and first and second electrodes formed on the other surface opposite to the one surface, of the piezoelectric material member to superimpose to the common electrode. The first and second electrodes have side edges facing with each other via a uniform width space, respectively.

Furthermore, the present invention provides a HGA including a magnetic head slider with at least one thin-film magnetic head element, an actuator fixed to the magnetic head slider for performing precise positioning of the at least one thin-film magnetic head element, and a support member for fixing and supporting the actuator. The actuator has a displacement generation part. This displacement part includes a solid piezoelectric material member, a common electrode formed on one surface of the piezoelectric material member to cover substantially whole of the one surface, and first and second electrodes formed on the other surface opposite to the one surface, of the piezoelectric material member to superimpose to the common electrode. The first and second electrodes have side edges facing with each other via a uniform width space, respectively.

A common electrode and first and second electrodes or drive electrodes are formed on the opposite surfaces of a piezoelectric material member, respectively. Each of the first and second electrodes has a side edge. These side edges faces with each other via a uniform width space or slit. This uniform width space or slit between the first and second electrodes provides the similar functions as that of the air gap of the conventional actuator shown in FIG. 2 to produce substantially the same bending displacement in a plane of the electrodes as the conventional actuator without forming the air gap.

Since there is no air gap in the displacement generation part and it is possible to fabricate the this part only by printing the electrodes on the piezoelectric material member, the manufacturing process becomes very simple. Thus, manufacturing time and cost of the actuator can be remarkably reduced.

Also, since there is no air gap, the shock resistance of the actuator can be extremely increased.

Furthermore, since the width of the space or slit between the first and second electrodes can be adjusted by controlling the printing of the electrodes, the stroke of displacement of the actuator can be very easily controlled. In addition, since the spacing can be reduced to a limit of the printing technology, a larger bending amount or a larger stroke of displacement of the actuator can be easily obtained.

It is preferred that the common electrode and the first and second electrodes are substantially symmetric with respect to a center line of the piezoelectric material member.

It is preferred that the displacement generation part consists of a single layer structure of the piezoelectric material member, the common electrode formed on one surface of the single layer structure piezoelectric material member, and the first and second electrodes formed on the other surface opposite to the one surface of the single layer structure piezoelectric material member, or the displacement generation part consists of a multi-layered structure of plurality of stacked the piezoelectric material members, the common electrode formed on one surface of each of the multi-layered structure piezoelectric material members, and the first and second electrodes formed on the other surface opposite to the one surface of each of the multi-layered structure piezoelectric material members. If the displacement generation part has the multi-layered structure as the latter case, the voltage for driving the actuator can be lowered. Also, this multi-layered structure can be fabricated by simply stacking the piezoelectric material layers resulting the manufacturing processes to greatly simplify.

It is also preferred that the displacement generation part has a substantially rectangular parallelepiped shape.

It is preferred that the actuator further comprises fixing parts coupled to both ends of the displacement generation part. In this case, more preferably, the fixing part has a substantially rectangular parallelepiped shape with a width equal to or larger than a width of the displacement generation part.

Further objects and advantages of the present invention will be apparent from the following description of the preferred embodiments of the invention as illustrated in the accompanying drawings.

DESCRIPTION OF THE PREFERRED EMBODIMENTS

Figure 3:
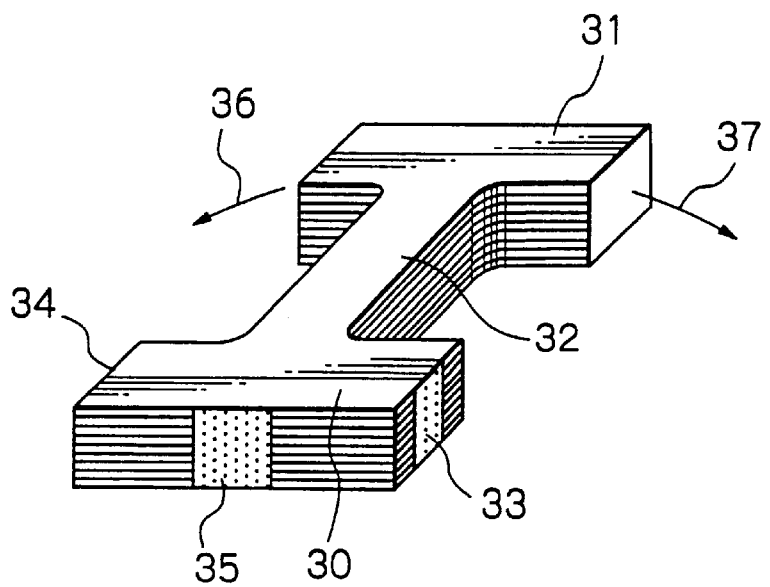
FIG. 3 is an oblique view schematically illustrating an outer configuration of a precise positioning actuator as a preferred embodiment according to the present invention.
Figure 4A:
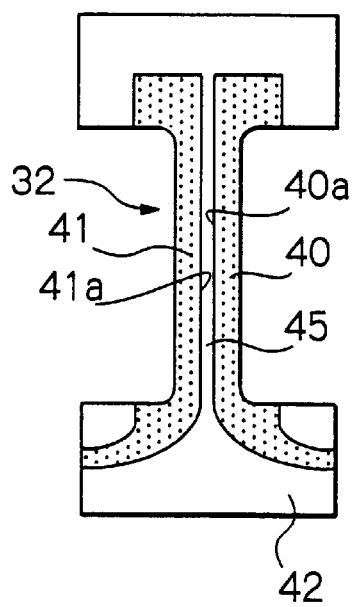
FIGS. 4a and 4b are plane views illustrating first and second piezoelectric material layers and electrodes formed on one surfaces of the respective layers in the embodiment shown in FIG. 3.
Figure 4B:
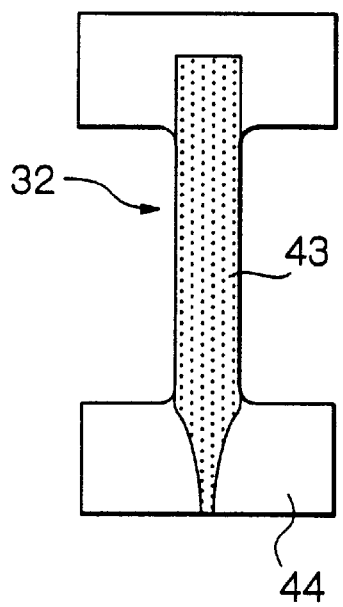

FIG. 3 schematically illustrates an outer configuration of a precise positioning actuator as a preferred embodiment according to the present invention, and FIGS. 4a and 4b illustrate first and second piezoelectric material layers and electrodes formed on one surfaces of the respective layers of the actuator.

As shown in FIG. 3, the actuator in this embodiment has two fixing parts 30 and 31 at its longitudinal end sections and one rod shaped beam part or bending motion part 32 for coupling these fixing parts 30 and 31. The bean part 32 corresponding to the displacement generation part according to the present invention is formed by a substantially rectangular solid block, and the fixing parts 30 and 31 are formed by substantially rectangular solid blocks with a larger width than that of the beam part 32 so as to increase the fixing area resulting sufficient fixing or adhering strength to provide. Thus, the actuator is formed to have a tuning fork shape or a I-shaped plane. The actuator has a multi-layered structure fabricated by stacking a plurality of piezoelectric material layers that expand and contract by reverse piezoelectric effect or by electrostrictive effect.

On each piezoelectric material layer, drive electrodes or a common electrode are formed as shown in FIGS. 4a and 4b. FIG. 4a indicates a first piezoelectric material layer 42 with first and second drive electrodes 40 and 41 formed on its upper surface, and FIG. 4b indicates a second piezoelectric material layer 44 with a common electrode 43 formed on its upper surface.

As indicated in FIG. 4a, on the upper surface of the beam part 32, the first and second drive electrodes 40 and 41 are patterned to have respective inner edges 40a and 41a opposed with each other via a space or slit 45 with a uniform width (distance). The center line of the slit 45 coincides with the center line of the beam part 32 of the actuator. In other words, the first and second drive electrodes 40 and 41 are symmetric with respect to the center line of the beam part 32.

Also, as indicated in FIG. 4b, the common electrode 43 is patterned to cover at least the whole upper surface of the beam part 32.

Figure 1:
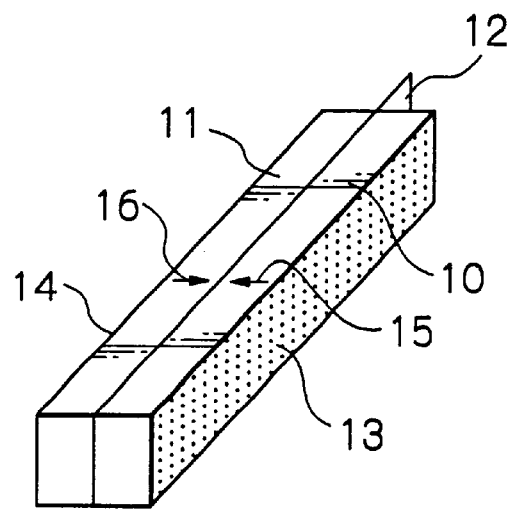
FIG. 1, already described, is an oblique view of a typical structure of the conventional piezoelectric actuator (bimorph) for precisely positioning an object.
Figure 2:
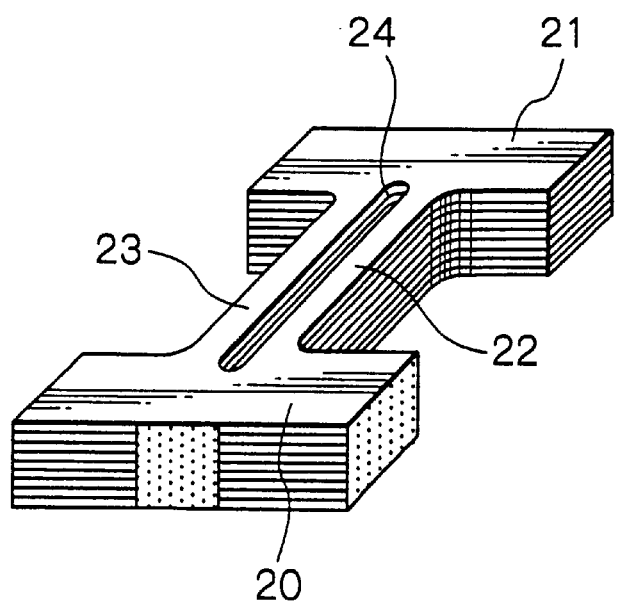
FIG. 2, already described, is an oblique view of a structure of the conventional piggyback piezoelectric actuator.
Figure 5:
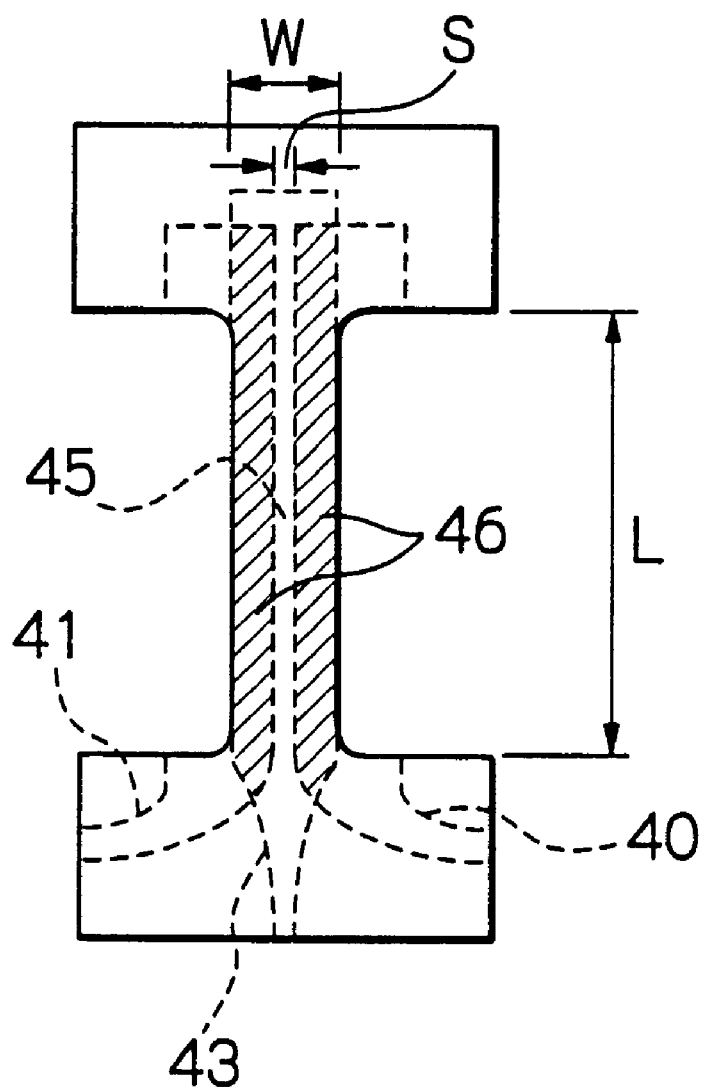
FIG. 5 is a plane view illustrating patterns of drive electrodes and a common electrode formed on the upper surface of rod shaped beam parts in the embodiment shown in FIG. 3.

As will be understood from FIG. 5, superimposed regions 46 of the first and second drive electrodes 40 and 41 and the common electrode 43 produce bending displacement of the beam part. The slit 45 provides the same functions as the air gap of the actuator shown in FIG. 2. Thus, the actuator in this embodiment can provide substantiality the same bending displacement in a plane of the first and second layers 42 and 44 as that of the actuator shown in FIG. 2 without forming the air gap.

The bending displacement Disp is obtained by the following approximate expression:

$$\text{Disp } L^2/(W+S)$$

where L is a length of the bean part 32, W is a width of the beam part 32 and S is the width of the slit 45.

The actuator has the multi-layered structure fabricated by stacking the first piezoelectric material layer 42 with the first and second drive electrodes 40 and 41 on the second piezoelectric material layer 44 with the common electrode 43, alternately stacking these first and second piezoelectric material layers 42 and 44, and finally stacking a piezoelectric material layer with no electrode on the first piezoelectric material layer 42.

The first and second drive electrodes 40 and 41 of the stacked layers are electrically connected to drive electrode terminals 33 and 34 formed on both side surfaces of the fixing part 30, respectively. The common electrode 43 of the stacked layers are electrically connected to a common electrode terminal 35 formed on the remaining side surface of the fixing part 30.

Hereinafter, operations of the actuator will be described in detail.

In case that the piezoelectric material layers are made of piezoelectric material such as PZT (Lead Zicconate Titanate), the piezoelectric material layers are in general polarized so as to improve their displacement performance. The polarized direction is the thickness direction of the actuator. When voltage is applied across the electrodes and the direction of the produced electrical field is the same as the polarized direction, the piezoelectric material layer between the electrodes expands in its thickness direction (piezoelectric longitudinal effect) and contracts in its in-plane direction (piezoelectric lateral effect). Contrary to this, when the direction of the produced electrical field is in inverse as the polarized direction, the piezoelectric material layer between the electrodes contracts in its thickness direction (piezoelectric longitudinal effect) and expands in its in-plane direction (piezoelectric lateral effect).

If the voltage with a polarity which win induce the contraction is applied to the first drive electrode 40 and the second drive electrode 41 alternately, a ratio between the length of one side edge portion of the bean part 32 (first drive electrode side) and the other side edge portion of the beam part 32 (second drive electrode side) changes resulting that both side edge portions of the bean part 32 bend toward the same direction in a plane of the actuator. By this bending motion, the fixing part 30 (or 31) swings around the fixing part 31 (or 30) along arrows 36 and 37 shown in FIG. 3. If no voltage is applied, the fixing part 30 (or 31) stays at the center position.

This swing is the displacement of the fixing part 31 to draw an arc locus in the direction substantially perpendicular to the expanding and contracting direction of the side edge portions of the beam parts 32, and the arc locus is in a plane of the actuator. Therefore, an object or a magnetic head element attached to the fixing part 31 also swings to draw the arc locus. Due to operating the same direction between the applied voltage and the polarization in the piezoelectric material layers, no attenuation in polarization in occurs.

Similar swing motion can be obtained even if the voltage alternately applied to the first and second drive electrodes 40 and 41 is that inducing expansion of the side edge portion of the beam part 32.

In the embodiment, voltages that induce mutually reverse motions may be simultaneously applied to the first and second drive electrodes 40 and 41, respectively. In other words, AC voltages may be simultaneously applied to the first and second drive electrodes 40 and 41 so that one side edge portion of the beam part 32 expands when the other side edge portion of the beam part 32 contracts and vice versa. The swing motion of the fixing part 31 is centered when no voltage is applied to the drive electrodes. In this case, the amplitude of the swing motion of the fixing part 31 becomes about twice of that when the voltage is alternately not simultaneously applied to the drive electrodes under the condition that the driving voltage levels are the same.

However, in this case, one of the side edge portions of the beam part is expanded and therefore the direction of the driving voltage opposes to that of the polarization in the piezoelectric material layer. Thus, if the applied voltage is high or the voltage is continuously applied, attenuation in polarization of the piezoelectric material layer may occur. It is desired therefore that a constant DC bias voltage in the same direction as the polarization direction be additionally applied to the AC voltage to form the driving voltage so that the direction of the driving voltage never opposes to that of the polarization in the piezoelectric material layer. The swing motion of the fixing part 31 is centered when only the bias voltage is applied to the drive electrodes.

In this specification, the piezoelectric material is material that expands or contracts by their reverse piezoelectric effect or electrostrictive effect. Any piezoelectric material applicable for the beam part of the actuator can be used. However, for high rigidity, it is desired to use a ceramics piezoelectric material such as $PZT[Pb(Zr,Ti)O_3]$, $PT(PbTiO_3)$, $PLZT[(Pb,La)(Zr,Ti)O_3]$, or barium titanate $(BaTiO_3)$.

Figure 6:
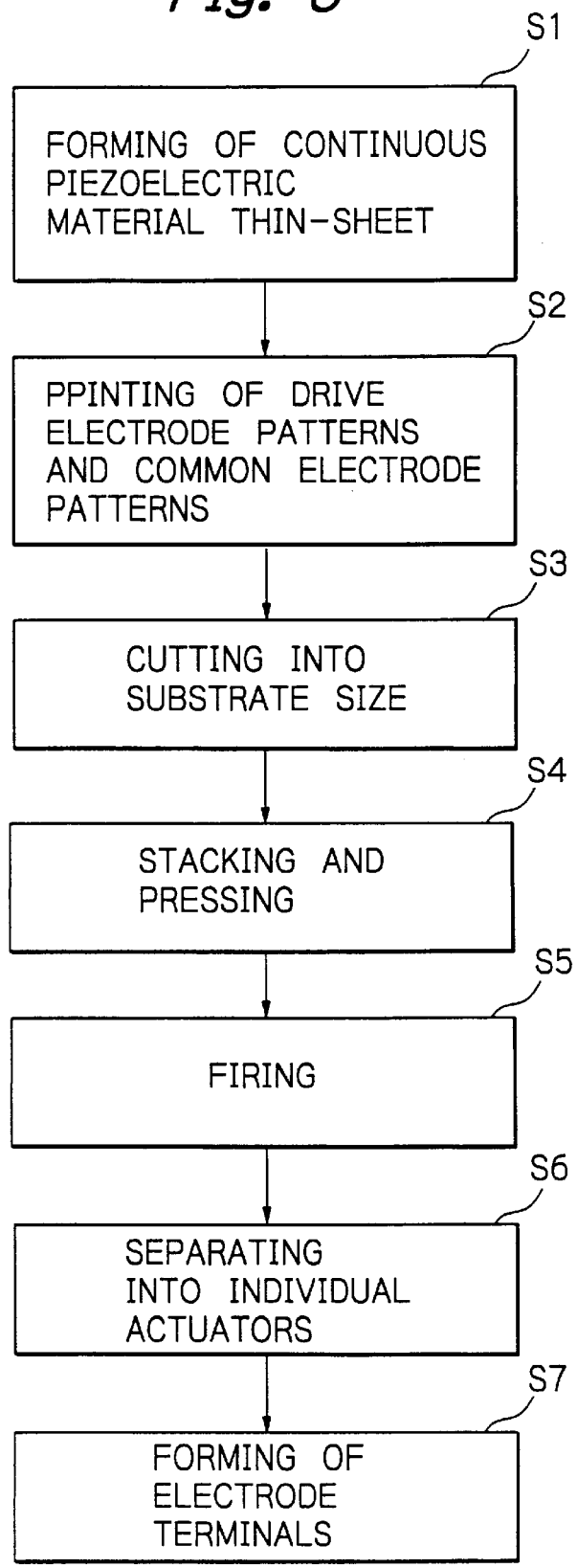
FIG. 6 is a flow chart schematically illustrating manufacturing processes of the actuator in the embodiment shown in FIG. 3.

FIG. 6 schematically illustrates manufacturing processes of the actuator in this embodiment. Hereinafter, the manufacturing processes of the actuator will be briefly described.

First, a piezoelectric material in paste is shaped to form a continuous piezoelectric material thin-sheet (Step S1).

Then, patterns of a plurality of first and second drive electrodes and patterns of a plurality of common electrodes are individually printed on the continuous piezoelectric material thin-sheet (Step S2).

Then, this continuous piezoelectric material thin-sheet is cut into separate piezoelectric material thin-sheets with a size of each substrate (Step S3). On each separate piezoelectric material thin-sheet, many of electrode patterns are formed in matrix.

Thereafter, these separate piezoelectric material thin-sheets are stacked in a predetermined order and pressed to form a stacked sheets (Step S4). This stacking is executed as aforementioned in the order to stack the first piezoelectric material thin-sheet with the first and second drive electrodes on the second piezoelectric material thin-sheet with the common electrodes, to alternately stack these first and second piezoelectric material thin-sheets, and to finally stack a piezoelectric material thin-sheet with no electrode on the first piezoelectric material thin-sheet.

Then, after via-holes and via-hole conductors are formed if necessary, the stacked sheets are fired under applying pressure to form a multi-layered structure (Step S5).

Thereafter, the multi-layered structure is separated by a certain method into individual actuators with an I-shaped plane (Step S6).

Then, with respect to the individual actuator, the drive electrode terminals 33 and 34 and the common electrode terminal 35 are formed on the side surface of the fixing part 30 by firing printed electrode patterns for example (Step S7).

The actuator has in this embodiment a united structure of the fixing parts and the beam part formed through multi-layers of piezoelectric material with partially formed electrodes. Thus, high rigidity and accurate dimensions of the actuator can be expected without occurring assembling error. Also, since no adhesive is used for fabricating the actuator, no adhesive layer exists at the portion where stress will be produced by the deformation of the beam part. Thus, no mechanical transformation loss due to the adhesive layer and no deterioration in adhesive strength occur.

Particularly, in this embodiment, since there is no air gap in the rod-shaped beam part or bending motion part 32 and it is possible to fabricate the this part 32 only by printing the electrodes on the piezoelectric material thin-sheets, the manufacturing process becomes very simple. Thus, manufacturing time and cost of the actuator can be remarkably reduced. Also, since there is no air gap, the shock resistance of the actuator can be extremely increased. Furthermore, since the width of the slit 45, namely spacing between the first and second drive electrodes 40 and 41 can be adjusted by controlling the printing of the electrodes, the stroke of displacement of the actuator can be very easily controlled. Also, since the spacing can be reduced to a limit of the printing technology, a larger bending amount or a larger stroke of displacement of the actuator can be easily obtained.

In addition, according to this embodiment, as the actuator has the multi-layered structure of the piezoelectric material layers. The voltage for driving the actuator can be lowered. Also, this multi-layered structure can be fabricated by simply stacking the piezoelectric layers resulting the manufacturing processes to greatly simplify.

Following is an application example of such precise positioning actuator to a HGA.

Figure 7:
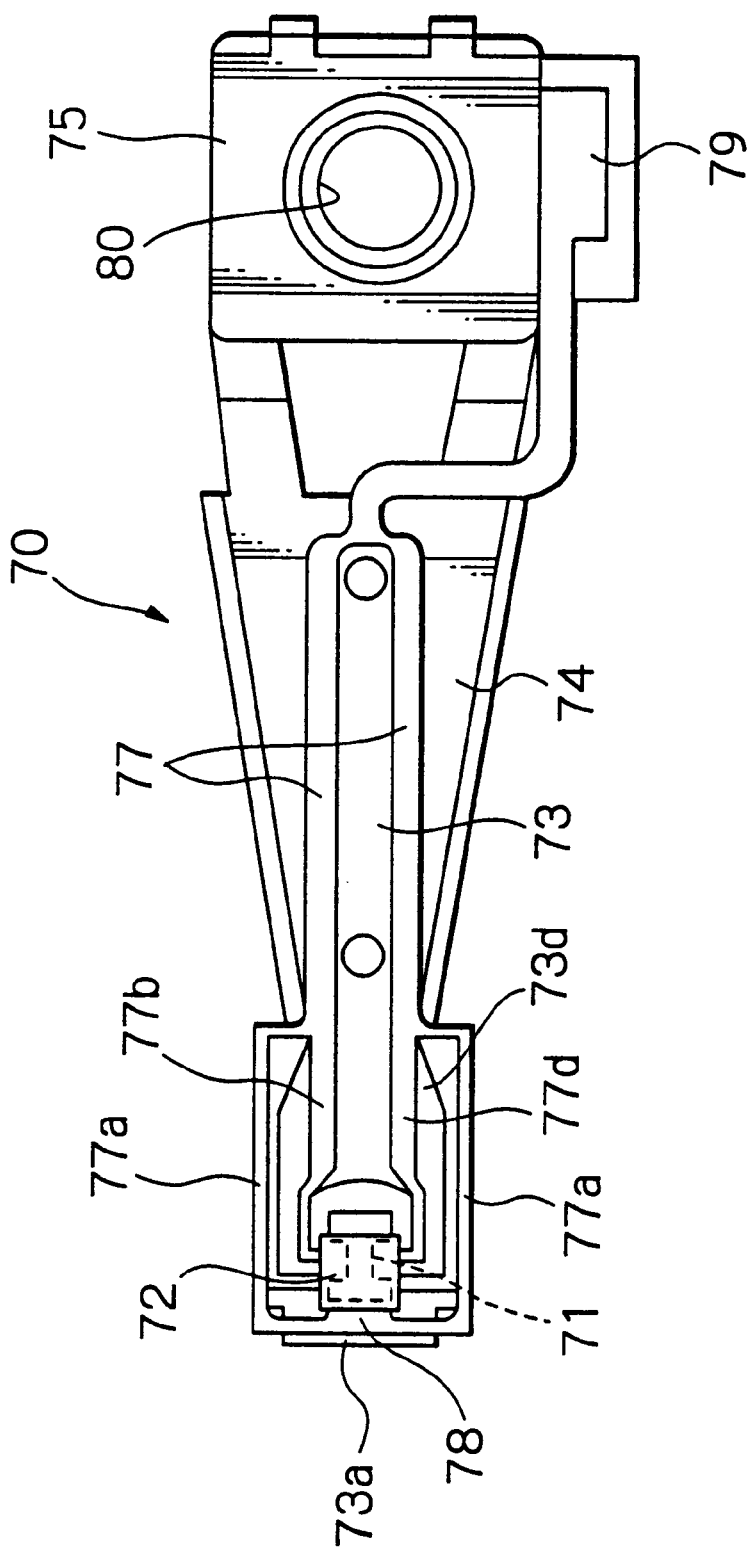
FIG. 7 is a plane view schematically illustrating whole structure of a HGA with the actuator in the embodiment shown in FIG. 3.
Figure 8:
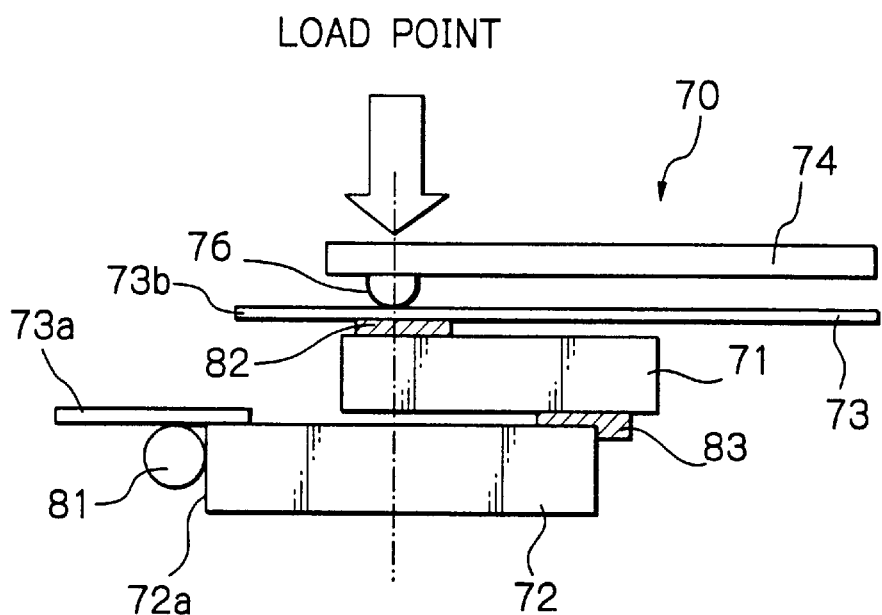
FIG. 8 is a side view schematically illustrating an attachment structure of the precise positioning actuator and a magnetic head slider with a flexure in the HGA shown in FIG. 7.

A FIG. 7 schematically illustrates whole structure of the HGA with the actuator in the embodiment shown in FIG. 3, and FIG. 8 schematically illustrates an attachment structure of the actuator and a magnetic head slider with a flexure in the HGA.

As shown in these figures, the HGA is assembled by fixing a fine tracking actuator 71 for precise positioning of a thin-film magnetic head element to a top end section of a suspension 70, and by fixing a magnetic head slider 72 with the thin-film magnetic head element to the actuator 71.

As is well known, a HDD has a main or course actuator of VCM for rotationally moving a movable arm to which such HGA is attached. The actuator 71 contributes the fine positioning of the HGA, which cannot be adjusted by the main or course actuator.

The actuator 71 is mechanically coupled to the slider 72 and mechanically and electrically coupled to the suspension 70. The size of the actuator 71 is substantially equal to that of the slider 72 with for example 1.25 mm×1.0 mm×0.3 mm.

In this example, the actuator 71 is mounted at a position of the top end section of the suspension 70, near the slider 72, in consideration of its mechanical and electrical performance. Also, the actuator 71 and the slider 72 are mounted on a surface of the suspension 70, which surface will be faced to the magnetic disk surface in operation. Although it is not shown, a drive IC chip including head amplifiers for the magnetic head element and a drive c it for the actuator 71 may be mounted on a middle location of the suspension 70.

The suspension 70 is substantially formed by a resilient flexure 73 which carries the slider 72 through the actuator 71 at its tongue located near its top end section, a resilient load beam 74 which supports and fixes the flexure 73, and a base plate 75 formed at a base end section of the load beam 74.

The load beam 74 has a projection or dimple 76 for applying a load to the magnetic head slider 72. Namely, the load from the suspension 70 is applied from the projection 76 to the slider 72 via the flexure 73 and the actuator 71. Thus, the position of this projection 76 is a load point as shown in FIG. 8. The load beam 74 has elasticity for pressing the slider 72 through the actuator 71 toward the direction of a magnetic disk in operation.

The flexure 73 has the flexible tongue depressed by the projection or dimple 76 formed on the load beam 74 and has elasticity for supporting flexibly the slider 72 through the actuator 71 by this tongue. As will be noted, in this example, the suspension 70 has a three-pieces structure constituted by individual components of the flexure 73, the load beam 74 and the base plate 75. In such three-pieces structure, stiffness of the flexure 73 is set to be lower than that of the load beam 74.

The flexure 73 is made of in this example a stainless steel plate (for example SUS304TA) with a thickness of about 25

μm. As will be described later, a top end section 73a of the flexure 73 is separated from' other section 73b of the flexure 73.

On the flexure 73 and out of the flexure 73, flexible conductor member 77 each including a plurality of trace conductors of a thin-film multi-layered pattern are formed. The conductor members 77 are formed by a known method similar to the patterning method of forming a printed circuit board on a thin metal plate such as a flexible printed circuit (FPC). For example, the member 77 are formed by sequentially depositing a first insulation material layer made of a resin such as polyimide with a thickness of about 5 μm, a patterned Cu layer (trace conductor layer) with a thickness of about 4 μm, and a second insulation material layer made of a resin such as polyimide with a thickness of about 5 μm on the flexure 73 in this order. Within the regions of the connection pads formed for connecting with the actuator 71, the magnetic head slider and an external circuit, an Au layer is deposited on the Cu layer and there is no second insulation material layer on the Au layer.

In this example, as shown in FIG. 7, the conductor member 77 consist of a first conductor member 77a including two trace conductors connected to the thin-film magnetic head element for one side, thus four trace conductors for both sides, and a second conductor member 77b including two trace conductors connected to the actuator 71 for one side, thus four trace conductors for both sides.

One end of the trace conductors of the first conductor member 77a is electrically connected to head element connection pads 78 formed on the individually separated top end section 73a of the flexure 73. The connection pads 78 are ball-bonded to terminal electrodes of the magnetic head slider 72 by Au balls 81 as shown in FIG. 8. The other end of the trace conductors of the first conductor member 77a is electrically connected to external circuit connection pads 79 provided for connection with external circuits. Thus, the first conductor member 77a consists of a first section formed on the other section 73b of the flexure 73, a second section floating in the air at both sides of the actuator 71 and the magnetic head slider 72, and a third section formed on the individually separated top end section 73a of the flexure 73. The top end section 73a and the other section 73b of the flexure 13 are located in different planes, respectively. However, since the air-floating section of the first conductor member 77a can freely bend, electrical connection between the conductor member 77a and the thin-film magnetic head element can be ensured without applying stress to the individually separated top end section 73a of the flexure 73.

Instead of the ball bonding, stitch bonding can be executed for connecting the terminal electrodes of the magnetic head slider 72 with the connection pads 78.

One end of trace conductors of the second conductor member 77b is electrically connected to actuator connection pads formed on the tongue of the flexure 73. These connection pads are connected to the drive electrode terminals and the common electrode terminal of the actuator 71. The other end of trace conductors of the second conductor member 77b is electrically connected to the external circuit connection pads 79.

The load beam 74 is made of in this example a resilient stainless steel plate with a thickness of about 60–65 μm and supports the other section 73b of the flexure 73 along its whole length. This load beam 74 has a shape with a width that narrows with approaching to its top end. Fixing of the flexure 73 to the load beam 74 is achieved by means of a plurality of welded spots.

The base plate 75 is made of a stainless steel or iron and is fixed to the base end section of the load beam 74 by welding. The suspension 70 will be attached to each movable arm (not shown) by fixing an attachment part 80 of the base plate 75 to the movable arm.

In modification, the suspension may be formed in a two-pieces structure with a base plate and a flexure-load beam instead of the three-pieces structure with the flexure 73, the load beam 74 and the base plate 75.

As shown in FIG. 8, the fixing part 30 (hereinafter called as "steady part") of the actuator 71 is fixed to the tongue of the flexure 73 by using adhesive 81. This fixing is executed so that the steady part 30 is located at a front end side of the actuator 71 with respect to the suspension and that the projection 76 of the load beam 74 is located in the area of the steady part 30 preferably near the center of the steady part 30.

Since the load point of the suspension 70 locates at the area of the steady part 30 of the actuator 71, any shock applied to the suspension 70 is transferred to the steady part 30 not the beam part 32 of the actuator 71 resulting the shock resistance to improve. Also, no load is applied to other part of the actuator 71, there occurs little friction between the actuator 71 and the suspension 70 resulting that motion of the actuator 71 is not impaired.

The fixing of the actuator 71 to the flexure 73 may be achieved by solder bonding the drive electrode terminals 33 and 34 and the common electrode terminal formed on the steady part 30 of the actuator 71 with the connection pads formed on the flexure 73, or by adhering using conductive adhesives the drive electrode terminals 33 and 34 and the common electrode terminal formed on the steady part 30 of the actuator 71 with the connection pads formed on the flexure 73, instead of adhering them using adhesives.

The fixing part 31 (hereinafter called as movable part) of the actuator 71 is fixed by using adhesives 83 to a rear end section, at which side the thin-film magnetic head element is formed, on a flat surface opposite to the air bearing surface (ABS) of the slider 72. This fixing is executed so that the movable part 31 is located at a rear end side of the actuator 71 with respect to the suspension 70.

As aforementioned, one end of the beam part 32 is united with the steady part 30 and this steady part 30 is fixed to the flexure 73. The other end of the beam part 32 is united with the movable part 31 and this movable part 31 is fixed to the slider 72. Thus, bending motion of the beam part 32 due to expanding and contracting of its side edge portions generates the displacement of the movable part 31 and therefore the displacement of the slider 72. This displacement of the slider 72 results the swing of the thin-film magnetic head element along an arc so as to cross recording tracks of the magnetic disk surface. Particularly, in this example, the movable part 31 of the actuator 71 is fixed to one end portion of the magnetic head slider 72 opposite to the other end 72a on which the thin-film magnetic head element is formed, and the distance between the other end 72a of the slider 72 and the fixed position of the slider 72 to the actuator 71 is longer than the distance between the steady part 30 and the movable part 31 of the actuator 71. In other words, the other end 72a of the slider 72, on which the thin-film magnetic head element is formed, is ahead located from the fixed position of the actuator 71 to the flexure 73. Thus, the displacement of the thin-film magnetic head element is greatly larger than that of the actuator 71 resulting the stroke of displacement of the actuator 71 to increase.

Figure 9:
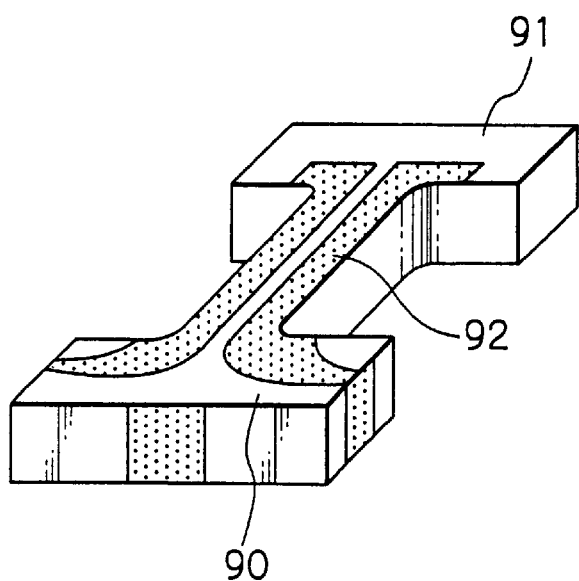
FIG. 9 is an oblique view schematically illustrating an outer configuration of a precise positioning actuator as another embodiment according to the present invention.

FIG. 9 schematically illustrates an outer configuration of a precise positioning actuator as another embodiment according to the present invention.

As shown in the figure, the actuator in this embodiment has two fixing parts 90 and 91 at its longitudinal end sections and one rod shaped beam part or bending motion part 92 for coupling these fixing parts 90 and 91. The beam part 92 is formed by a substantially rectangular solid block, and the fixing parts 90 and 91 are formed by substantially rectangular solid blocks with a larger width than that of the beam part 92 so as to increase the fixing area resulting sufficient fixing or adhering strength to provide. Thus, the actuator is formed to have a tuning fork shape or a I-shaped plane.

The actuator in this embodiment is fabricated in a single layer structure of a piezoelectric material block that expands and contracts by reverse piezoelectric effect or by electrostrictive effect.

First and second drive electrodes as shown in FIG. 4a are formed on one surface of the piezoelectric material block, and a common electrode as shown in FIG. 4b is formed on the other or opposite surface of the block.

Configurations and operations of this embodiment are the same as those of the embodiment of FIG. 3 except that the first and second drive electrodes and the common electrode are formed on the front and rear surfaces of the piezoelectric material block, respectively. Also, advantages of this embodiment are the same as that of the embodiment of FIG. 3 except that relatively high voltage is required to drive such single layer structure actuator.

Figure 10:
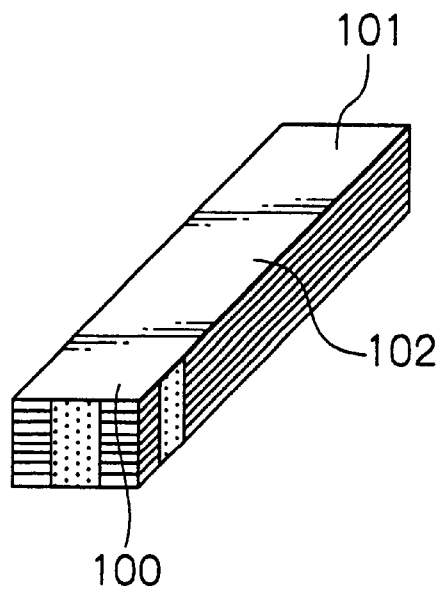
FIG. 10 is an oblique view schematically illustrating an outer configuration of a precise positioning actuator as a further embodiment according to the present invention.

FIG. 10 schematically illustrates an outer configuration of a precise positioning actuator as a further embodiment according to the present invention.

As shown in the figure, the actuator in this embodiment has two fixing parts 100 and 101 at its longitudinal end sections and one rod shaped beam part or bending motion part 102 for coupling these fixing parts 100 and 101. The beam part 102 is formed by a substantially rectangular solid block, and the fixing parts 100 and 101 are formed by substantially rectangular solid blocks with the same width as that of the bean part 102. Thus, the actuator is formed as a whole to have a rectangular parallelepiped shape or a rectangular plane.

The actuator in this embodiment has a multi-layered structure fabricated by stacking a plurality of piezoelectric material layers that expand and contract by reverse piezoelectric effect or by electrostrictive effect.

Configurations, operations and advantages of this embodiment are the same as those of the embodiment of FIG. 3 except that the shape of the fixing parts, thus the shape of the whole actuator, differs from that of the former embodiment.

Figure 11:
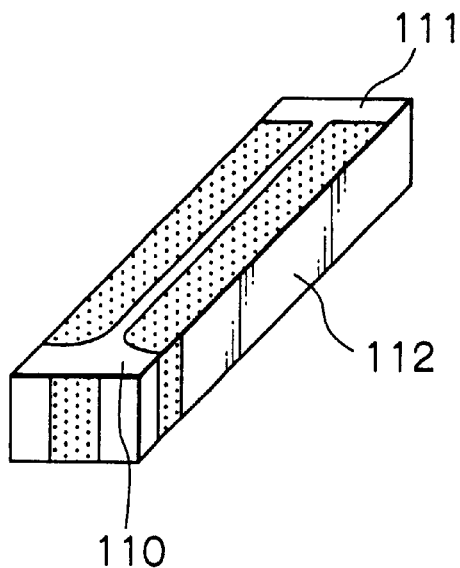
FIG. 11 is an oblique view schematically illustrating an outer configuration of a precise positioning actuator as a still further embodiment according to the present invention.

FIG. 11 schematically illustrates an outer configuration of a precise positioning actuator as a still further embodiment according to the present invention.

As shown in the figure, the actuator in this embodiment has two fixing parts 110 and 111 at its longitudinal end sections and one rod shaped beam part or bending motion part 112 for coupling these fixing parts 110 and 111. The beam part 112 is formed by a substantially rectangular solid block, and the fixing parts 110 and 111 are formed by substantially rectangular solid blocks with the same width as that of the beam part 112. Thus, the actuator is formed as a whole to have a rectangular parallelepiped shape or a rectangular plane.

The actuator in this embodiment is fabricated in a single layer structure of a piezoelectric material block that expands and contracts by reverse piezoelectric effect or by electrostrictive effect.

First and second drive electrodes as shown in FIG. 4a are for on one surface of the piezoelectric material block, and a common electrode as shown in FIG. 4b is formed on the other or opposite surface of the block.

Configurations and operations of this embodiment are the same as those of the embodiment of FIG. 3 except that the first and second drive electrodes and the common electrode are formed on the front and rear surfaces of the piezoelectric material block, respectively and that the shape of the fixing parts, thus the shape of the whole actuator, differs from that of the former embodiment. Also, advantages of this embodiment are the same as that of the embodiment of FIG. 3 except that relatively high voltage is required to drive such single layer structure actuator.

Although the above-mentioned example is the HGA with the actuator for precisely positioning the thin-film magnetic head element, an actuator according to the present invention can be used for precisely positioning any object other than the thin-film magnetic head element.

The aforementioned shapes of the actuator are mere examples and it will be understood the actuator according to the present invention is formed in one of various shapes which are not limited to these examples.

Many widely different embodiments of the present invention may be constructed without departing from the spirit and scope of the present invention. It should be understood that the present invention is not limited to the specific embodiments described in the specification, except as defined in the appended claims.

What is claimed is:

1. An actuator for precisely positioning an object to be positioned, fixed between said object and a support member, said actuator including a displacement generation part comprising:
   a solid piezoelectric material member;
   a common electrode formed on one surface of said piezoelectric material member to cover substantially whole of said one surface; and
   first and second electrodes formed on the other surface opposite to said one surface, of said piezoelectric material member to superimpose to said common electrode, said first and second electrodes having side edges facing with each other via a uniform width space, respectively.

2. The actuator as claimed in claim 1, wherein said common electrode and said first and second electrodes are substantially symmetric with respect to a center line of said piezoelectric material member.

3. The actuator as claimed in claim 1, herein said displacement generation part consists of a single layer structure of said piezoelectric material, said common electrode formed on one surface of said single layer structure piezoelectric material member, and said first and second electrodes formed on the other surface opposite to said one surface of said single layer structure piezoelectric material member.

4. The actuator as claimed in claim 1, wherein said displacement generation part consists of a multi-layered structure of plurality of stacked said piezoelectric material members, said common electrode formed on one surface of each of said multi-layered structure piezoelectric material members, and said first and second electrodes formed on the other surface opposite to said one surface of each of said multi-layered structure piezoelectric material members.

5. The actuator as claimed in claim 1, wherein said displacement generation part has a substantially rectangular parallelepiped shape.

6. The actuator as claimed in claim 1, wherein said actuator further comprises fixing parts coupled to both ends of said displacement generation part.

7. The actuator as claimed in claim 6, wherein said fixing part has a substantially rectangular parallelepiped shape with a width larger than a width of said displacement generation part.

8. The actuator as claimed in claim 6, wherein said fixing part has a substantially rectangular parallelepiped shape with a width equal to a width of said displacement generation part.

9. An actuator for precisely positioning at least one thin-film magnetic head element to be positioned, fixed between a magnetic head slider with said at least one thin-film magnetic head element and a support member, said actuator including a displacement generation part comprising:

a solid piezoelectric material m a common electrode formed on one surface of said piezoelectric material member to cover substantially whole of said one surface; and first and second electrodes formed on the other surface opposite to said one surface, of said piezoelectric material member to superimpose to said common electrode, said first and second electrodes having side edges facing with each other via a uniform width space, respectively.

10. The actuator as claimed in claim 9, wherein said common electrode and said first and second electrodes are substantially symmetric with respect to a center line of said piezoelectric material member.

11. The actuator as claimed in claim 9, wherein said displacement generation part consists of a single layer structure of said piezoelectric material member, said common electrode formed on one surface of said single layer structure piezoelectric material member, and said first and second electrodes formed on the other surface opposite to said one surface of said single layer structure piezoelectric material member.

12. The actuator as claimed in claim 9, wherein said displacement generation part consists of a multi-layered structure of plurality of stacked said piezoelectric material members, said common electrode formed on one surface of each of said multi-layered structure piezoelectric material members, and said first and second electrodes formed on the other surface opposite to said one surface of each of said multi-layered structure piezoelectric material members.

13. The actuator as claim 9, wherein said displacement generation part has a substantially rectangular parallelepiped shape.

14. The actuator as claimed in claim 9, wherein said actuator further comprises fixing parts coupled to both ends of said displacement generation part.

15. The actuator as claimed in claim 14, wherein said fixing part has a substantially rectangular paralelepiped shape with a width larger than a width of said displacement generation part.

16. The actuator as claimed in claim 14, wherein said fixing part has a substantially rectangular parallelepiped shape with a width equal to a width of said displacement generation part.

17. A head gimbal assembly including a magnetic head slider with at least one thin-film magnetic head element, an actuator fixed to said magnetic head slider for performing precise positioning of said at least one thin-film magnetic head element, and a support member for fixing and supporting said actuator, said actuator including a displacement generation part comprising:

a solid piezoelectric material member;

a common electrode formed on one surface of said piezoelectric material member to cover substantially whole of said one surface; and first and second electrodes formed on the other surface opposite to said one surface, of said piezoelectric material member to superimpose to said common electrode, said first and second electrodes having side edges facing with each other via a uniform width space, respectively.

18. The head gimbal assembly as claimed in claim 17, wherein said common electrode and said first and second electrodes are substantially symmetric with respect to a center line of said piezoelectric material member.

19. The head gimbal assembly as claimed in claim 17, wherein said displacement generation part consists of a single layer structure of said piezoelectric material, said common electrode for on one surface of said single layer structure piezoelectric material member, and said first and second electrodes formed on the other surface opposite to said one surface of said single layer structure piezoelectric material member.

20. The head gimbal assembly as claimed in claim 17, wherein said displacement generation part consists of a multi-layered structure of plurality of stacked said piezoelectric material members, said cannon electrode formed on one surface of each of said multi-layered structure piezoelectric material member, and said first and second electrodes formed to the other surface opposite to said one surface of each of said multi-layered structure piezoelectric material members.

21. The head gimbal assembly as claimed in claim 17, wherein said displacement generation part has a substantially rectangular parallelepiped shape.

22. The head gimbal assembly as claimed in claim 17, wherein said actuator further comprises fixing parts coupled to both ends of said displacement generation part.

23. The head gimbal assembly as claim in claim 22, wherein said fixing part has a substantially rectangular parallelepiped shape with a width larger than a width of said displacement generation part.

24. The head gimbal assembly as claimed in claim 22, wherein said fixing part has a substantially rectangular parallelepiped shape with a width equal to a width of said displacement generation part.

* * * * *